United States Patent
Lai et al.

(10) Patent No.: US 10,599,583 B2
(45) Date of Patent: Mar. 24, 2020

(54) PRE-MATCH SYSTEM AND PRE-MATCH METHOD

(71) Applicant: MACRONIX INTERNATIONAL CO., LTD., Hsinchu (TW)

(72) Inventors: Yi-Ting Lai, Taoyuan (TW); Chih-He Chiang, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/105,230

(22) Filed: Aug. 20, 2018

(65) Prior Publication Data

US 2020/0057727 A1    Feb. 20, 2020

(51) Int. Cl.
| | |
|---|---|
| *G06F 9/34* | (2018.01) |
| *G06F 12/02* | (2006.01) |
| *G06F 12/00* | (2006.01) |
| *G06F 12/1009* | (2016.01) |
| *G06F 12/10* | (2016.01) |
| *G06F 12/06* | (2006.01) |
| *G06F 12/0802* | (2016.01) |

(52) U.S. Cl.
CPC ...... *G06F 12/1009* (2013.01); *G06F 12/0246* (2013.01); *G06F 12/0802* (2013.01); *G06F 2212/1032* (2013.01)

(58) Field of Classification Search
CPC .............. G06F 12/1009; G06F 2212/1032
USPC ................................................... 711/210
See application file for complete search history.

(56) References Cited

U.S. PATENT DOCUMENTS

| | | | | |
|---|---|---|---|---|
| 5,325,332 A | * | 6/1994 | Tagaya ................... | G11C 29/24 365/200 |
| 5,787,496 A | * | 7/1998 | Kobayashi ............. | G11B 19/04 711/220 |
| 6,026,052 A | * | 2/2000 | Fukutani ................. | G11C 8/18 365/226 |
| 6,614,685 B2 | | 9/2003 | Wong | |
| 6,615,378 B1 | * | 9/2003 | Dwork ............... | G01R 31/3187 254/134.3 FT |
| 6,762,965 B2 | | 7/2004 | Benedix et al. | |
| 7,158,425 B2 | | 1/2007 | Chen et al. | |
| 7,330,078 B1 | * | 2/2008 | Li ............................ | H03L 7/18 327/156 |
| 7,633,800 B2 | | 12/2009 | Adusumilli et al. | |
| 7,663,950 B2 | | 2/2010 | Moogat et al. | |
| 9,001,601 B2 | | 4/2015 | Son et al. | |

(Continued)

FOREIGN PATENT DOCUMENTS

EP    1717814 A1    11/2006

OTHER PUBLICATIONS

TIPO Office Action dated Jul. 5, 2019, Taiwan Application # 107128749, pp. 1-5.

*Primary Examiner* — Ly D Pham
(74) *Attorney, Agent, or Firm* — McClure, Qualey & Rodack, LLP

(57) ABSTRACT

A pre-match method includes: receiving an initial address; gradually increasing a current address according to the initial address; adding an offset value to the current address for generating a match address; generating a hit parameter by comparing the match address with at least one defect address stored in the mapping table; generating a redundancy address corresponding to the match address; and setting a Y-direction address as either the redundancy address or the current address according to the hit parameter.

18 Claims, 8 Drawing Sheets

(56) References Cited

U.S. PATENT DOCUMENTS

| | | | |
|---|---|---|---|
| 2008/0056618 A1* | 3/2008 | Yoshino | G06T 3/4015 382/300 |
| 2008/0285347 A1* | 11/2008 | Byeon | G11C 29/76 365/185.09 |
| 2010/0306263 A1* | 12/2010 | Cassetti | G06F 7/02 707/776 |
| 2013/0242655 A1* | 9/2013 | Tsai | G11C 29/848 365/185.09 |
| 2014/0013185 A1* | 1/2014 | Kobla | G11C 11/4097 714/768 |
| 2016/0026469 A1* | 1/2016 | Lin | G06F 12/0862 712/234 |
| 2017/0132140 A1* | 5/2017 | Lin | G06F 12/00 |
| 2018/0341479 A1* | 11/2018 | Temam | G06F 9/345 |

* cited by examiner

PRE-MATCH SYSTEM AND PRE-MATCH METHOD

BACKGROUND

Field of Invention

The present disclosure relates to a pre-match system and a pre-match method. More particularly, the present disclosure relates to a pre-match system and a pre-match method applied for a NAND flash memory.

Description of Related Art

In recent years, NAND flash memory is widely used due to the huge data capacity and data non-volatility. Also, the large capacity makes NAND flash memory suitable for memory card, USB flash drive and storage device of mobile devices. To expand the advantage, the flash memory cell is fabricated as small as possible; in this case, with such a complex device production process, the chip yield is hard to maintain without redundancy and ECC (Error Correction Code).

With the progress of science and technology, processors are asked to implement more and more complicated calculation, which means that the required memory capacity and data throughput would dramatically increase. To catch up this trend, DDR (Double Data Rate) I/O interface is a popular choice to achieve high speed data transfer. But for address replacement method, it is almost impossible to access data in such a short data access time, which includes internal data transfer time and column repair time.

For the foregoing reasons, how to reduce the data access time in the NAND memory is a problem that the industry is eager to solve.

SUMMARY

One embodiment of the application provides a pre-match system including: a memory array; an input and output circuit configured to receive an initial address; an address counter coupled to the input and output circuit, the address counter being configured to gradually increase a current address according to the initial address; an adder coupled to the address counter, the adder being configured to add an offset value to the current address for generating a match address; a mapping table being configured to store at least one defect address; a mapping circuit coupled to the mapping table and the adder, the mapping circuit being configured to generate a hit parameter by comparing the match address with the at least one defect address stored in the mapping table, and to generate a redundancy address corresponding to the match address; a first register coupled to the mapping circuit, the first register being configured to store the hit parameter; a second register coupled to the mapping circuit, the second register being configured to store the redundancy address; and a multiplexer coupled to the first register and the second register, the multiplexer being configured to set a Y-direction address as either the current address or the redundancy address stored in the second register according to the hit parameter stored in the first register, the Y-direction address being corresponding to accessing the memory array.

Another embodiment of the application provides a pre-match method for a pre-match system having a memory array. The pre-match method including: receiving an initial address; gradually increasing a current address according to the initial address; adding an offset value to the current address for generating a match address; generating a hit parameter by comparing the match address with at least one defect address stored in the mapping table; generating a redundancy address corresponding to the match address; and setting a Y-direction address as either the redundancy address or the current address according to the hit parameter.

It is to be understood that both the foregoing general description and the following detailed description are only examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
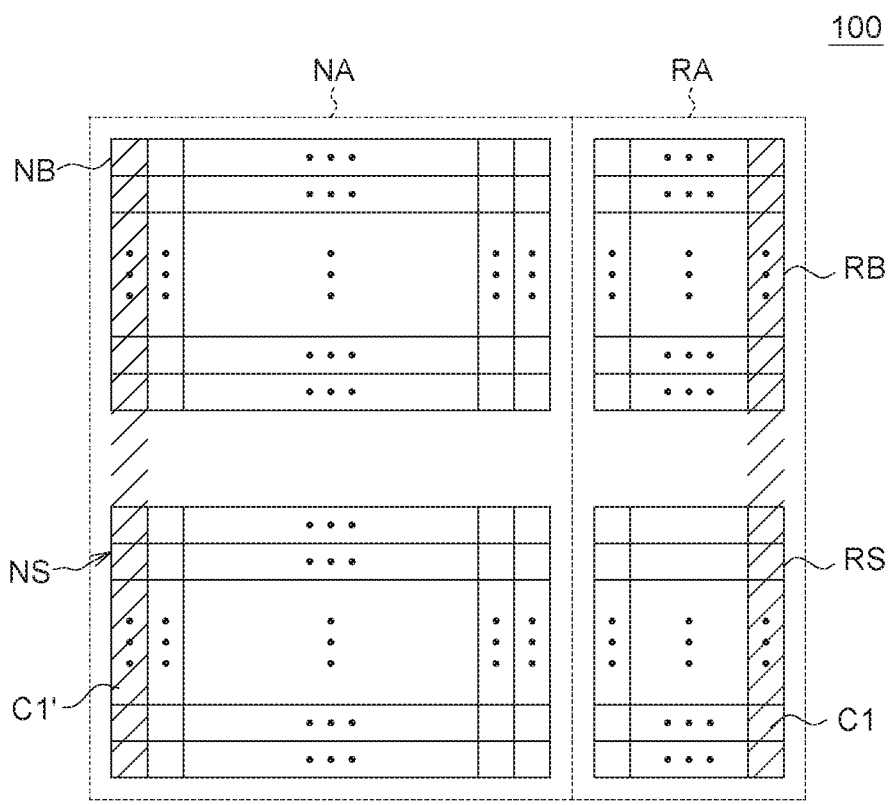
FIG. 1 depicts a schematic diagram of a redundancy structure of a NAND flash memory according to one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 depicts a schematic diagram of a redundancy structure 100 of a NAND flash memory according to one embodiment of the present disclosure. The redundancy structure 100 comprises a normal array NA and a redundancy array RA. The normal array NA can be used for storing normal data, and the redundancy array RA can be used for storing redundancy data. The normal array NA comprises normal block(s) NB and spare block(s) NS, and the redundancy array RA comprises redundancy block(s) RB and spare redundancy block(s) RS. In one embodiment, the redundancy function is created by the normal block NB, the spare block NS, the redundancy block RB and the spare redundancy block RS. The redundancy function includes X-direction redundancy and Y-direction redundancy. X-direction redundancy is created by the spare block NS and the spare redundancy block RS, and the spare block NS and the spare redundancy block RS may be used to replace a bad block in the normal block(s) NB and the redundancy block(s) RB respectively. And, redundancy array RA, which serves as Y-direction redundancy, includes several spare columns which would replace a bad column in the normal array NA.

For example, column C1 is the Y-direction redundancy column of the redundancy array RA. And, column C1 may be used for replacing column C1' when column C1' includes defect(s) (i.e. when the column C1' is bad).

It should be noticed that the pre-match system and the pre-match method in one embodiment of the present application is not limited to the redundancy structure 100 of a NAND flash memory. The pre-match system and the pre-match method in one embodiment of the present application may apply to other circuits for improving the data access time to catch up the transfer speed of interface (e.g., Double Data Rate (DDR) interface). The pre-match system and the pre-match method are further described in following paragraphs. The following embodiments use the redundancy structure 100 of a NAND flash memory as examples for the convenience of understanding.

Figure 2:
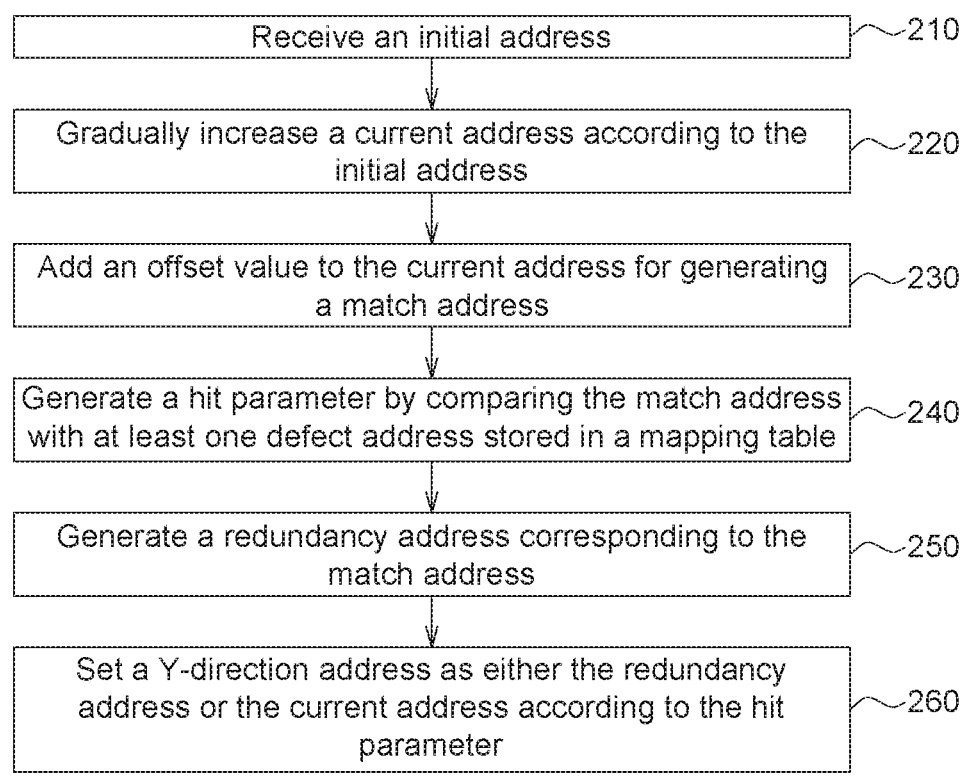
FIG. 2 depicts a flowchart of the pre-match method according to one embodiment of the present disclosure.
Figure 3:
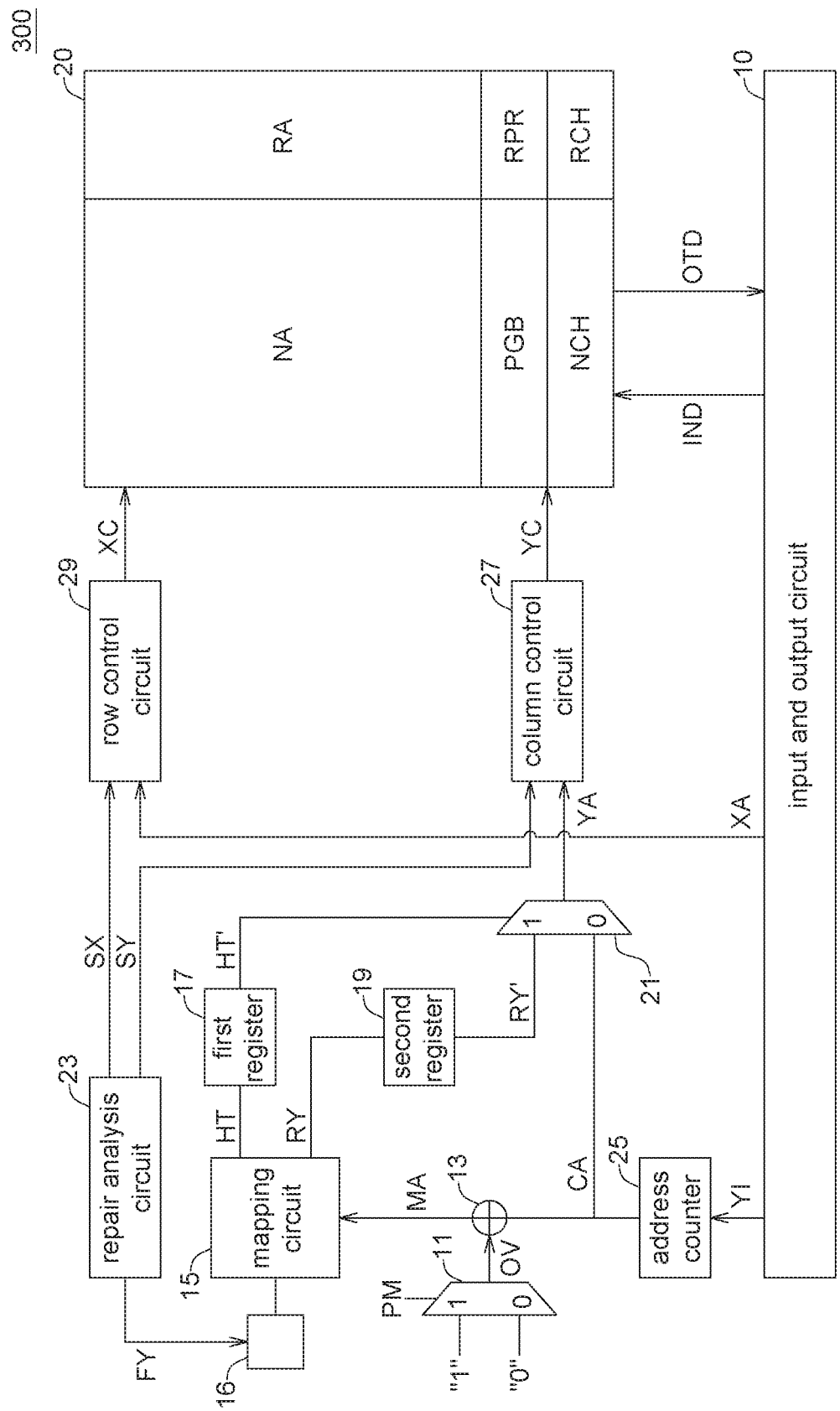
FIG. 3 depicts a pre-match system according to one embodiment of the present disclosure.

A description is provided with reference to FIG. 2 and FIG. 3. FIG. 2 depicts a flowchart of the pre-match method according to one embodiment of the present disclosure. FIG. 3 depicts a pre-match system 300 according to one embodiment of the present disclosure. In one embodiment, the pre-match system 300 comprises a memory array 20, an input and output circuit 10, an address counter 25, an adder 13, a mapping circuit 15, a mapping table 16, a first register 17, a second register 19 and a multiplexer 21. In one embodiment, the memory array 20 includes a normal array NA, a redundancy array RA, a page buffer PGB, a normal cache NCH, a redundancy buffer RPR, and a redundancy cache RCH. In one embodiment, the first register 17 and the second register 19 may be implemented by D flip-flop, respectively. In one embodiment, the mapping table 16 may be realized by any kind of circuit elements which can store data. For example, the mapping table 16 may be implemented by the content addressable memory (CAM) circuit. And, the mapping circuit 15 can access the mapping table 16.

It should be noticed that the implementation of the first register 17 and the second register 19 in one embodiment of the present application is not limited to the D flip-flop. Other embodiments of the present application may use other types of register having the same function. For example, the registers 17 or 19 may be a latch, a capacitor, a memory cell or any other circuit elements able to memorize the data. For describing easily, the embodiments in the present application use D flip-flops as examples for the first register 17 and the second register 19.

In step 210, the input and output circuit 10 receives an initial address YI. In one embodiment, the input and output circuit 10 receives a command request and calculates the initial address YI to be accessed according to the command request. For example, the input and output circuit 10 obtains the initial address YI (e.g., first address "addr[5]") when the command request needs to access the serial data positioned at the address ranging from "addr[5]" to "addr[9]" of the normal array NA. In the following description, the first, the second, the third and the fourth addresses represent the sequential access order in the command request. For example, for a command request accessing addr[5] to addr[40], the first address is addr[5], the second address is addr[6], the third address is addr[7], and so on.

In step 220, the address counter 25 is configured to gradually increase a current address CA according to the initial address YI. In one embodiment, the address counter 25 sets the initial value of the current address CA as the initial address YI, and then increases the current address CA by one for each cycle. For example, the current address CA is equal to the first address in the first cycle, equal to the second address in the second cycle, equal to the third address in the third cycle, and so on. Meanwhile, the address counter 25 transmits the current address CA to the adder 13 and the multiplexer 21.

In step 230, the adder 13 is configured to add an offset value OV to the current address CA for generating a match address MA. In one embodiment, the offset value OV is set as one. In other words, the match address MA may represent the next address to be accessed in a sequential memory access operation. For example, the adder 13 may add one to the current address CA (which may be equal to the first address "addr[5]") to generate the match address MA (which may be equal to the second address "addr[6]"). Note that the invention is not limited thereto. The offset value OV may be set as different integer values, as will be seen in other embodiments.

In one embodiment, the pre-match system 300 further comprises a function multiplexer 11 for providing the offset value OV. In the example shown in FIG. 3, the function multiplexer 11 receives two integers 0 and 1 as the input signals, and receives the pre-match selection signal PM as the selection signal. In one embodiment of the application, the pre-match selection signal PM is set to logic high if pre-match function is enabled, and set to logic low otherwise.

In step 240, the mapping circuit 15 is configured to generate a hit parameter HT by comparing the match address MA with at least one defect address stored in the mapping table 16.

In step 250, the mapping circuit 15 is configured to generate a redundancy address RY corresponding to the match address MA.

In one embodiment, the pre-match system 300 further comprises a repair analysis circuit 23 for checking defect status in the memory array 20, so as to generate the mapping table 16. Therefore, the mapping table 16 stores the at least one defect address. The defect address refers to the address of the defect memory cell in the memory array.

Figure 4A:
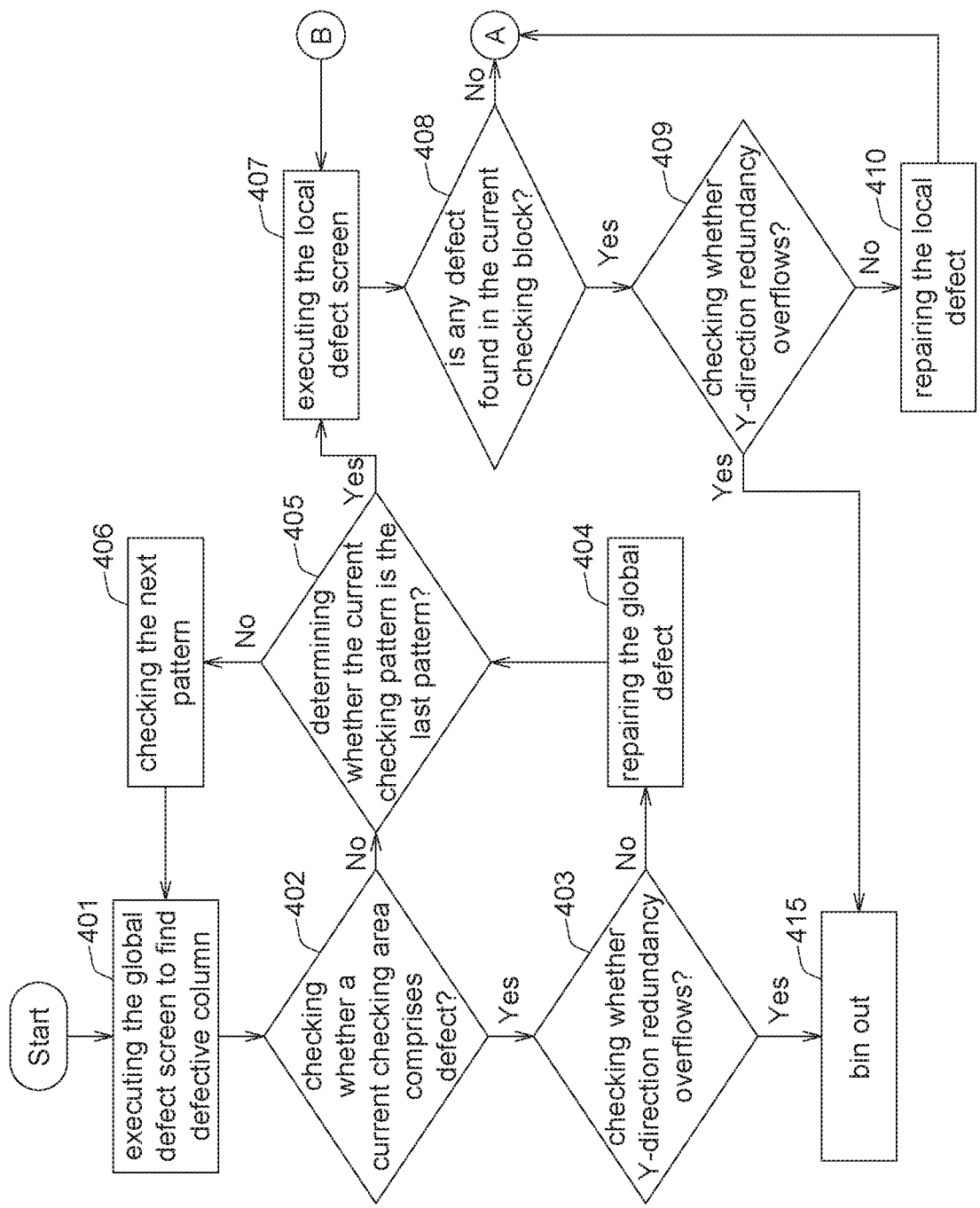
FIGS. 4A-4B depict a flowchart of Y-direction repair analysis method according to one embodiment of the present disclosure.
Figure 4B:
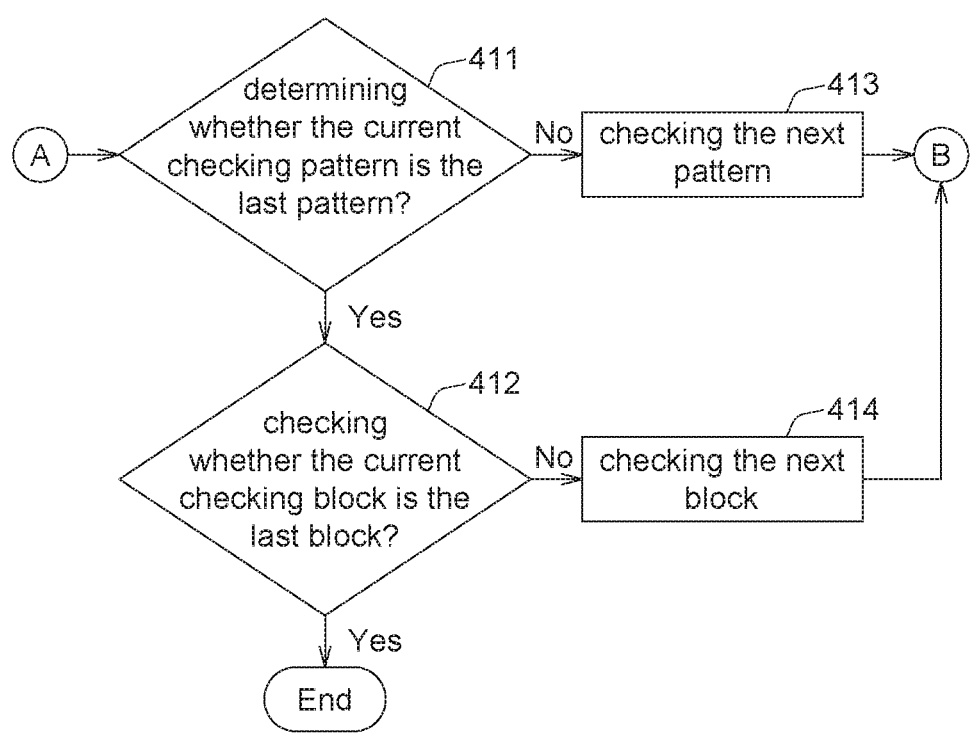

FIGS. 4A-4B depict a flowchart of Y-direction repair analysis method according to one embodiment of the present disclosure. In one embodiment, the defect column(s) in the memory array 20 can be found and repaired by Y-direction repair analysis method. It should be noticed that the present application is not limited to the Y-direction repair analysis method. The Y-direction repair analysis method is provided as an example for finding and repairing the defect part of the NAND flash memory.

In step 401, the mapping circuit 15 executes the global defect screen to find defective column. A column (e.g., column C1 and C1' in FIG. 1) involves, for example, a number of memory cells located in array (e.g., normal array NA and redundancy array RA in FIG. 3), several sets of sensing circuit, which are usually located in page buffer system (e.g., page buffer PGB and redundancy buffer RPR in FIG. 3), and cache circuits, which are located in the cache system (e.g., normal cache NCH and redundancy cache RCH in FIG. 3). Numerous columns construct a memory macro. The sensing circuit is used for recognizing the data in corresponding memory cell. And, data read by the sensing circuit can be transmitted to the cache. The cache temporarily stores the read-out data until the input and output circuit 10 fetches the data for users. The global defect screen can check the defect status by scanning the flash cell, sensing circuit and the cache circuit in every column.

In step 402, the repair analysis circuit 23 checks whether a current checking area comprises defect. If the current checking area comprises defect, the step 403 is performed.

Else, the step 405 is performed. In step 403, the mapping circuit 15 checks whether Y-direction redundancy is overflowing. Y-direction redundancy overflowing in step 403 means that there is no Y-direction redundancy left for repairing the global defect (e.g., the Y-direction redundancy space is full). If the determination result of the step 403 is yes, the step 415 is performed. Otherwise, the step 404 is performed.

In step 415, the repair analysis circuit 23 bins out the NAND flash memory because this NAND flash memory contains too many defects. In contrast, if Y-direction redundancy is not overflowing, the repair analysis circuit 23 utilizes the Y-direction redundancy for repairing the global defect in step 404. In step 405, the repair analysis circuit 23 determines whether the current checking pattern is the last pattern. If the current checking pattern is the last pattern, the step 407 is performed. Else, the step 406 is performed. In step 406, the repair analysis circuit 23 checks the next pattern.

In step 407, the repair analysis circuit 23 executes the local defect screen. It means that the repair analysis circuit 23 finds the defects in the current checking block. In step 408, if any defect is found in the current checking block, the step 409 is performed. Else, the step 411 is performed. In step 409, the repair analysis circuit 23 checks whether Y-direction redundancy overflows or not. Y-direction redundancy overflowing in step 409 means that no more Y-direction redundancy is available for repairing the local defect (e.g., the Y-direction redundancy space is full). If the determination result of the step 409 is yes, the step 415 is performed. Otherwise, the step 410 is performed. In step 410, the repair analysis circuit 23 uses the spare Y-direction redundancy for repairing the local defect. In step 411, the repair analysis circuit 23 determines whether the current checking pattern is the last pattern. If the current checking pattern is the last pattern, the step 412 is performed; else, the step 413 is performed. In step 413, the repair analysis circuit 23 checks the next pattern. In step 412, the mapping circuit 15 checks whether the current checking block is the last block. If the mapping circuit 15 determines that the current checking block is not the last block, the step 414 is performed to check the next block. Else, the Y-direction repair analysis method is ended.

In Y-direction repair analysis method of the embodiment of the application, both global defect and local defect are screened out. Once the defect is found, the repair analysis circuit 23 first checks whether the Y-direction redundancy is enough to repair or not. If Y-redundancy is enough to repair this defect, the column address of this defect column is written in the mapping table 16 and mapped to a redundancy address RY for column repair function that replaces the defect column by the redundancy address RY Note that in other embodiments known algorithms may also be applied to find the defects of NAND flash memory.

The repair analysis circuit 23 transmits the mapping result FY to the mapping table 16. The mapping circuit 15 compares the match address MA with at least one defect address stored in the mapping table 16. The mapping circuit 15 generates a hit parameter HT. If one of the at least defect address is the same as the match address MA, the hit parameter HT is set to logic high; otherwise the hit parameter HT is set to logic low. Also, the mapping circuit 15 finds a redundancy address RY corresponding to the match address MA.

The mapping circuit 15 transmits the hit parameter HT to the first register 17 and transmits the redundancy address RY to the second register 19. The first register 17 temporally stores the hit parameter HT. In one embodiment, the second register 19 temporally stores the redundancy address RY (e.g., address "r[0]" in redundancy array RA) corresponding to the match address MA. The redundancy address RY is used for replacing the match address MA when the match address MA is recorded as a fail address in the mapping table 16; that is, the match address MA is labeled as a defect address in the mapping table 16. In one embodiment, the first register 17 and the second register 19 may be D flip-flops. The hit parameter HT' output from the first register 17 may be a delayed version of the hit parameter HT, and the redundancy address RY' output from the second register 19 may be a delayed version of the redundancy address RY.

In step 260, the multiplexer 21 sets a Y-direction address YA as either the redundancy address RY' or the current address CA according to the hit parameter HT', and transmits the output address to the column control circuit 27. The Y-direction address YA is set as the redundancy address RY' when the hit parameter HT' is logic high, and the Y-direction address YA is set as the current address CA when the hit parameter HT' is logic low.

In one embodiment, when the hit parameter HT', as a judging signal, is set to logic low, the multiplexer 21 transmits the current address CA to the column control circuit 27, and the column control circuit 27 triggers a normal column in the normal array NA by the Y-direction control signal YC to output data corresponding to the Y-direction address YA. On the other hand, when the hit parameter HT' is set to logic high, the multiplexer 21 transmits the redundancy column address RY' to the column control circuit 27 to output the repair data from the redundancy array RA in FIG. 3. The signals SX and SY are address signals which is used for memory access in repair analysis (i.e. the signals SX and SY are not used for memory access in normal operations). In one embodiment, the unit of Y-direction repair may be one word, one byte, or even one bit.

In some embodiment, the row control circuit 29 also may be used for triggering the memory array by the X-direction control signal XC to output the correct data in X-direction. The pre-match system and the pre-match method can also be implemented in the X-direction by replacing the defect row data by the redundancy row data.

In one embodiment, when the Y-direction address YA is set as the redundancy address RY', data (e.g., correct data) corresponding to the Y-direction address YA is written into a redundancy buffer RPR and is outputted by a redundancy cache RCH. Once the redundancy address is accessed, the redundancy cache RCH can receive data from the input and output circuit 10 by the data signal IND and output data to the input and output circuit 10 by the data signal OTD.

In one embodiment, when the Y-direction address YA is set as the current address CA (an address for accessing the normal array NA), the data (e.g., correct data) corresponding to the Y direction address YA is written into a page buffer PGB and is outputted by a normal cache NCH. The normal cache NCH, if being accessed, can receive data from the input and output circuit 10 by the data signal IND and output data to the input and output circuit 10 by the data signal OTD.

Figure 5:
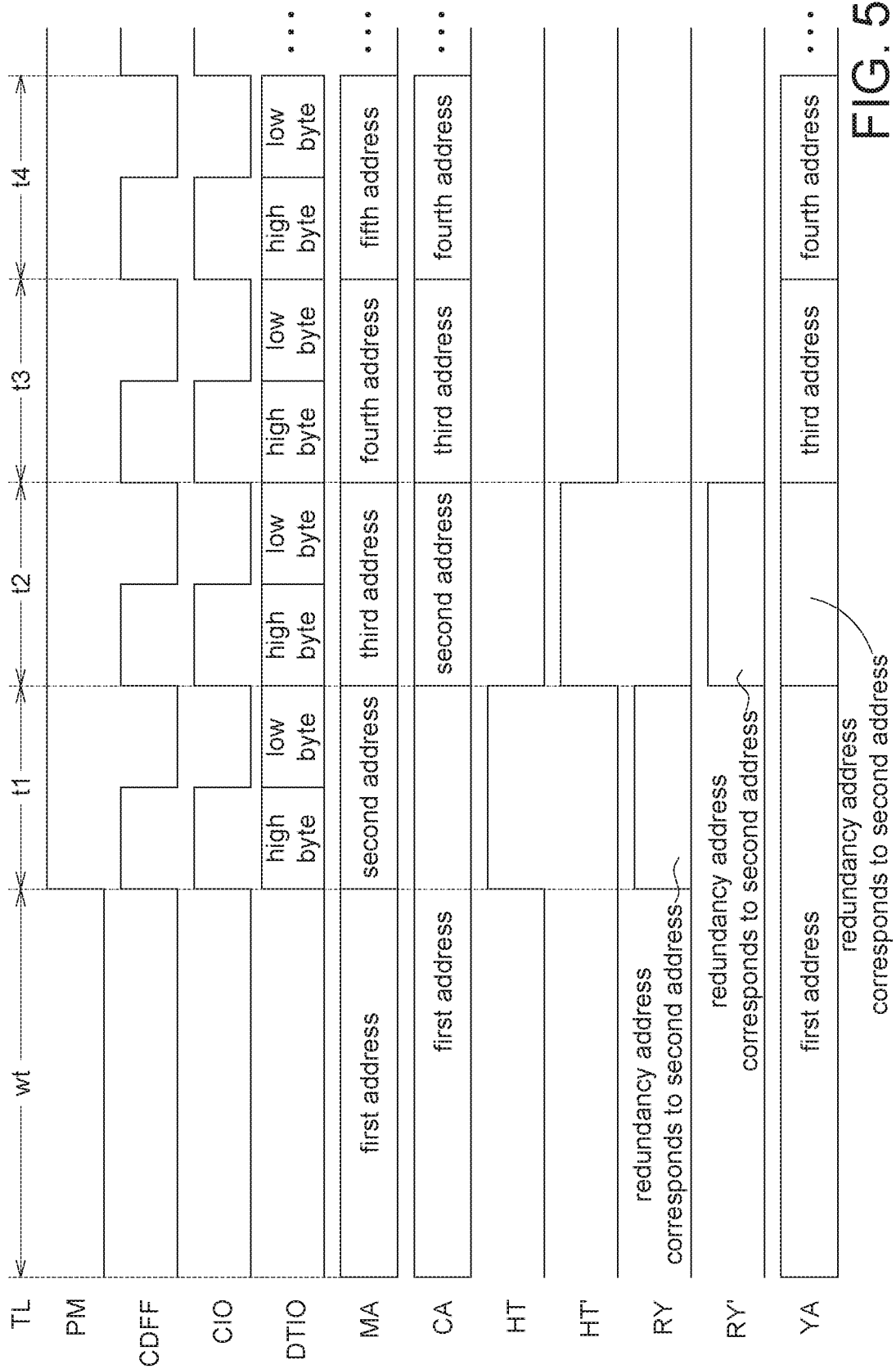
FIG. 5 depicts a timing diagram which can be applied to the pre-match system 300 in FIG. 3.

A description is provided with reference to FIG. 3 and FIG. 5. FIG. 5 depicts a timing diagram which can be applied to the pre-match system 300 in FIG. 3. In one embodiment, the timeline TL sequentially comprises wait time wt, time interval t1, time interval t2, time interval t3, time interval t4, etc. The period of each time interval t1-t4 is the same as the clock cycle CIO of the input and output circuit 10, and so as the clock CDFF of D flip-flop. The clock CDFF of the D flip-flop controls the timing of data receiving and transmitting of the first register 17 and the second register 19. Thus, the first register 17 and the second register 19 can operate synchronously. In one embodiment, the pre-match system 300 can use the double data rate (DDR) interface to output two bytes (e.g., a high byte and a low byte according to a voltage level) in one cycle, shown as the waveform of data in/out DTIO.

FIG. 5 represents the operation timing diagram of the pre-match method while assuming the match address MA needs to be repaired. In one embodiment, the address counter 25 transmits the current address CA to the adder 13. Since the pre-matching enable signal PM is still logic low during the wait time wt, the adder 13 directly bypasses the current address CA to the match address MA. Due to the assumption, which indicates that the first address is not recorded in the mapping table 16, the hit parameter HT is logic low because the mapping circuit 15 determines that the match address MA does not match with any defect address recorded in the mapping table 16. Thus, during the time interval t1, the hit parameter HT' is logic low because the hit parameter HT is logic low in the previous time interval wt, and the Y-direction address YA would be the same as the current address CA consequently. On the other hand, the pre-match selection signal PM turns to logic high at the beginning of time interval t1 Hence, the adder 13 generates the match address MA by adding one to the current address CA (the first address) and transmits the match address MA (the second address) toward the mapping circuit 15. Then the mapping circuit 15 compares the match address MA with the defect addresses stored in the mapping table 16 during the first time interval t1. As the assumption, the match address MA matches one of at least one defect address stored in the mapping table 16 so that the hit parameter HT stored in the first register 17 changes to logic high and the second register 19 temporally stores the redundancy address RY. In the next clock cycle, the hit parameter HT' and the redundancy address RY' are transmitted to the multiplexer 21 at the beginning of the time interval t2. And then, the data stored in the redundancy address RY' is outputted during the second time interval t2 (which is represented by the Y-direction address YA during the second time interval t2).

In this way, the Y-direction address YA is switched to the corresponding redundancy address RY' if the current address CA (original address) points to a fail column; otherwise, the Y-direction address YA is equal to the current address CA. Since in this example the third address and the fourth address are not recorded in the mapping table 16, as assumed, the pre-match system 300 simply sets the Y-direction address YA as the current address CA during the third time interval t3 and the fourth time interval t4.

Figure 6:
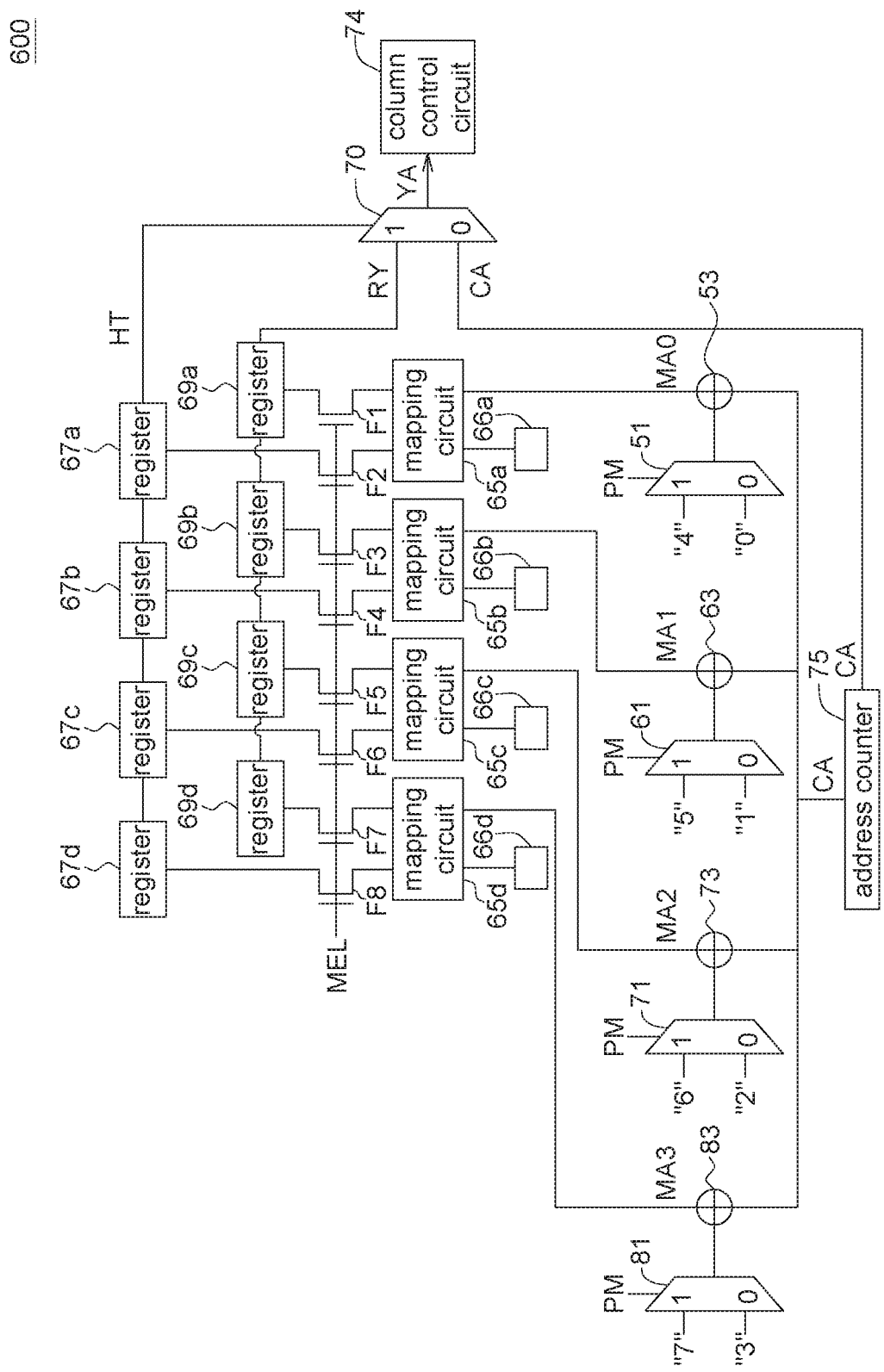
FIG. 6 depicts a pre-match system according to one embodiment of the present disclosure.

A description is provided with reference to FIG. 6. FIG. 6 depicts a pre-match system 600 according to one embodiment of the present disclosure. If the pre-matching time is longer than the output cycle time, in one embodiment, the pre-match system 600 (including the function multiplexers 51, 61, 71, 81, the address counter 75, the address multiplexer 70, the column control circuit 74 and the adders 53, 63, 73, 83) in FIG. 6 may replace the pre-match system 300 (including the function multiplexer 11, the address counter 25, the multiplexer 21, the column control circuit 27 and the adder 13) in FIG. 3. The function multiplexers 51, 61, 71, 81 may provide different offset values to the adders 53, 63, 73, 83. For example, based on the pre-match selection signal PM, the function multiplexer 51 sets the offset value for the adder 53 as either 0 or 4, the function multiplexer 61 sets the offset value for the adder 63 as either 1 or 5, the function multiplexer 71 sets the offset value for the adder 73 as either 2 or 6, and the function multiplexer 81 sets the offset value for the adder 83 as either 3 or 7.

The difference between FIG. 6 and FIG. 3 is that the pre-match system 600 in FIG. 6 separates the mapping table 16 in FIG. 3 into four partial mapping tables 66a-66d. Note that the number of partial mapping tables can be adjusted if needed. And, the pre-match system 600 comprises four mapping circuits 65a-65d for accessing corresponding partial mapping tables 66a-66d. Take FIG. 6 for example while the mapping table 16 in FIG. 3 is divided into 4 partial mapping tables 66a-66d. On the other hand, the defect addresses are sorted and stored in different partial mapping tables according to the corresponding defect addresses. In this case, the defect addresses being the multiple of 4, which is also represented as 4n while n is a integer, are stored in the partial mapping table 65a: the defect addresses being 4n+1 are stored in the partial mapping table 65b; the defect addresses being 4n+2 are stored in the partial mapping table 65c: and the defect addresses being 4n+3 are stored in the partial mapping table 65d.

In one embodiment, each mapping circuit 65a-65d corresponds to two kinds of registers, hit flag register 67a-67d and redundancy address register 69a-69d. For example, the mapping circuit 65a is coupled to the hit flag register 67a and the redundancy address register 69a, The function and operation of the hit flag register 67a-67d are the same as the first register 17 mentioned in FIG. 3. And, the function and operation of the redundancy address registers 69a-69d are the same as the second register 19 mentioned in FIG. 3. Further, the registers 67a-67d are connected in series, and the registers 69a-69d are connected in series. For example, a data output terminal (e.g. Q port of the D flip-flop) of the register 69b is coupled to a data input terminal (e.g. D port of the D flip-flop) of the register 69a, and so on. Once the memory load signal MEL goes logic high, the hit flag registers 67a-67d and the redundancy address 69a-69d are coupled to the corresponding mapping circuits 65a-65d by the transistors F1-F8. The transistors F1-F8 are coupled between the registers 69a-69d and the mapping circuits 65a-65d, respectively. The transistors F1-F8 are controlled by the memory load signal MEL.

Figure 7:
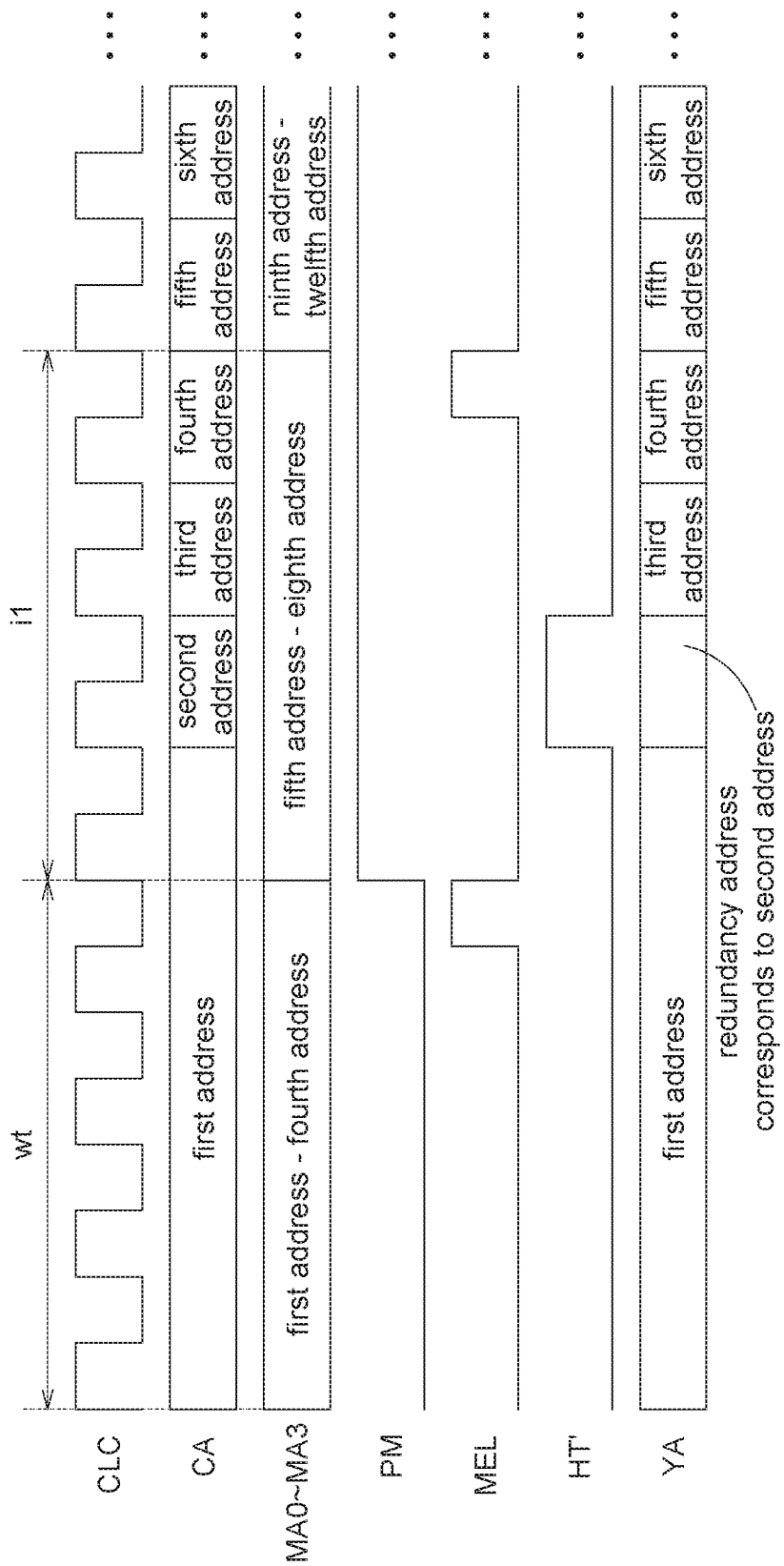
FIG. 7 depicts a timing diagram according to the pre-match system of FIG. 6.

FIG. 7 depicts a timing diagram according to the pre-match system 600 of FIG. 6 while assuming the second address needs to be repaired. In one embodiment, the pre-match system 600 of FIG. 6 uses DDR structure. However, the present application is not limited to the DDR structure. For example, other possible embodiment of the present application may also be applicable to the SDR (single data rate) structure.

During the wait time wt, the pre-match selection signal PM is set to logic low. In this way, the match addresses MA0~MA3 stand for the first four addresses while the current address CA is the initial address (which is the first address). Afterwards, the mapping circuits 65a-65d compare the received match address MA0~MA3 with the defect address in the mapping tables 66a-66d simultaneously. With the parallel processing between the mapping circuits 65a-65d, the matching time can be extended to four times of CLC cycle time.

At the last cycle of the wait time wt, the memory load signal MEL goes high for half cycle time to transmit the redundancy address and the hit flags in the mapping circuits 65a-65d to the redundancy address registers 69a-69d and the hit flag registers 67a-67d, Since it is assumed that only the second address comprises defect, as assumed, only the hit flag register 67b is set to logic high while other hit flag registers 67a, 67c and 67d are set to logic low when the memory load signal MEL goes high. In addition, the redundancy address corresponding to the second address is temporarily stored in the redundancy address register 69b at the same time.

After the first four redundancy address and hit flags in the mapping circuits 65a-65d are transmitted to the hit flag register 67a-67d and the redundancy address register 69a-69d while the memory load signal MEL goes high, the pre-match selection signal PM is pulled up in the fifth clock cycle CLC. The fifth clock cycle CLC to the eighth clock cycle CLC composes the time interval i1. In one embodiment, each time interval (e.g., time interval i1) comprises four clock cycles CLC. In the time interval i1, the match addresses MA0~MA3 are generated by adding 4, 5, 6 and 7 to the current address CA, which is still the initial address (the first address) in the fifth clock cycle, while the pre-match selection signal PM is set to logic high. In this way, the mapping circuits 65a-65d derive the next four address (e.g., the fifth address to the eighth address) for pre-matching function.

In one embodiment, every clock cycle CLC starting from the fifth clock cycle CLC triggers the events that, data stored in the redundancy address register 69b is shifted to the redundancy address register 69a (e.g., data stored in the redundancy address register 69b overwrites data stored in the redundancy address register 69a), data stored in the redundancy address register 69c is shifted to the redundancy address register 69b, data stored in the redundancy address register 69d is shifted to the redundancy address register 69c.

Since the first address does not need to be repaired, as assumed, the hit flag HT received from the hit flag register 67a during the fifth cycle is logic low. Thus, the address multiplexer 70 transmits the current address CA to the column control circuit 74 to output the data corresponding to the first address.

In the sixth clock cycle CLC, because the second address comprises defect, the hit flag of the second address, which has been transmitted from the hit flag register 67b to the hit flag register 67a during the fifth clock cycle CLC, is transmitted from the hit flag register 67a and functions as the hit parameter HT (i.e. the hit parameter HT is overwritten by the hit flag stored in the hit flag register 67b); also, the corresponding redundancy address of the second address, which has been transmitted from the redundancy address register 69b to the redundancy address register 69a during the fifth clock cycle CLC, is transmitted from the redundancy address register 69a and functions as the redundancy address RY (i.e. the redundancy address RY is overwritten by the redundancy address stored in the redundancy address register 69b). And then, hit flags stored in the hit flag registers 67b-67d are shifted to the right hit flag registers 67a-67c respectively; meanwhile, redundancy address stored in the redundancy address registers 69b-69d are shifted to the right redundancy address registers 69a-69c respectively. Since in this example the third address and the fourth address are not recorded in the mapping table 66c and 66d respectively, as assumed, the pre-match system 600 simply outputs the current address CA during the third time interval t3 and the fourth time interval t4.

It should be noticed that the present application is not limited to four mapping tables. The pre-match system in other possible embodiments of the application may adapt any number of mapping tables if needed. Thus, the pre-match system may reduce the calculating time by checking the defect address with multiple partial mapping tables 66a-66d at the same time. Also, the data size of each partial mapping tables 66a-66d can be smaller than that of the original mapping table. The mapping circuits 65a-65d can finish the comparing process faster.

Based on the description above and the detailed description of various embodiments, the pre-match system and the pre-match method can recognize whether the following address needs to be repaired or not. In a sequential access case, it is easy to pre-match the following address since the following address is linearly incremented. Afterwards, the following address is sent to the mapping table, where all defect addresses are recorded, to check whether the following column or row needs to be repaired or not. If any recorded address matches the following address, the mapping circuit obtains the corresponding redundancy column or row of the following address. And in the next cycle, the pre-match system directly outputs the data of the corresponding redundancy column or row. With this method, the data access time of NAND flash memory can be improved to catch up the speed of DDR or SDR interface.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A pre-match system comprising:
a memory array;
an input and output circuit configured to receive an initial address;
an address counter coupled to the input and output circuit, the address counter being configured to gradually increase a current address according to the initial address;
an adder coupled to the address counter, the adder being configured to add an offset value to the current address for generating a match address;
a mapping table being configured to store at least one defect address;
a mapping circuit coupled to the mapping table and the adder, the mapping circuit being configured to generate a hit parameter by comparing the match address with the at least one defect address stored in the mapping table, and to generate a redundancy address corresponding to the match address;
a first register coupled to the mapping circuit, the first register being configured to store the hit parameter;
a second register coupled to the mapping circuit, the second register being configured to store the redundancy address; and
a multiplexer coupled to the first register and the second register, the multiplexer being configured to set a Y-direction address as either the current address or the redundancy address stored in the second register according to the hit parameter stored in the first register, the Y-direction address being corresponding to accessing the memory array.

2. The pre-match system of claim 1, further comprising a column control circuit coupled to the multiplexer, the column control circuit being configured to receive the Y-direction address and to trigger the memory array to output data corresponding to the Y-direction address.

3. The pre-match system of claim 1, wherein the mapping circuit is configured to set the hit parameter to logic high if the match address matches the at least one defect address stored in the mapping table, and set the hit parameter to logic low if the match address does not match any of the at least one defect address stored in the mapping table.

4. The pre-match system of claim 1, wherein the multiplexer is configured to set the Y-direction address as the redundancy address when the hit parameter is logic high, and the multiplexer is configured to set the Y-direction address as the current address when the hit parameter is logic low.

5. The pre-match system of claim 1, further comprising a repair analysis circuit configured to check a defect status in the memory array, so as to generate the mapping table.

6. The pre-match system of claim 1, wherein the memory array comprises a redundancy buffer and a redundancy cache, when the Y-direction address is set as the redundancy address, data corresponding to the Y-direction address is written into the redundancy buffer and outputted by the redundancy cache.

7. The pre-match system of claim 1, wherein the memory array comprises a page buffer and a normal cache, when the Y-direction address is set as the current address, data corresponding to the Y-direction address is written into the page buffer and outputted by the normal cache.

8. The pre-match system of claim 1, further comprising a function multiplexer coupled to the adder, the function multiplexer being configured to set the offset value as either a first integer or a second integer in response to a pre-match selection signal, wherein the pre-match selection signal is set to logic high if a pre-match function is enabled.

9. The pre-match system of claim 1, further comprising:
a next-stage adder, configured to add a next-stage offset value to the current address for generating a next-stage match address, wherein the next-stage offset value is different from the offset value;
a next-stage mapping table configured to store at least one next-stage defect address;
a next-stage mapping circuit configured to generate a next-stage hit parameter by comparing the next-stage match address with the at least one next-stage defect address stored in the next-stage mapping table, and generate a next-stage redundancy address corresponding to the next-stage match address;
a next-stage first register configured to store the next-stage hit parameter, wherein a data output terminal of the next-stage first register is coupled to a data input terminal of the first register; and
a next-stage second register configured to store the next-stage redundancy address, wherein a data output terminal of the next-stage second register is coupled to a data input terminal of the second register.

10. The pre-match system of claim 9, further comprising:
a first transistor coupled between the first register and the mapping circuit, and
a second transistor coupled between the second register and the mapping circuit,
wherein the first transistor and the second transistor are controlled by a memory load signal.

11. A pre-match method for a pre-match system comprising a memory array, the pre-match method comprising:
receiving an initial address;
gradually increasing a current address according to the initial address;
adding an offset value to the current address for generating a match address;
generating a hit parameter by comparing the match address with at least one defect address;
generating a redundancy address corresponding to the match address;
setting a Y-direction address as either the redundancy address or the current address according to the hit parameter, the Y-direction address being corresponding to accessing the memory array; and
setting the offset value as either a first integer or a second integer in response to a pre-match selection signal, wherein the pre-match selection signal is set to logic high if a pre-match function is enabled.

12. The pre-match method of claim 11, further comprising:
triggering the memory array to output data corresponding to the Y-direction address.

13. The pre-match method of claim 11, wherein generating the hit parameter comprises:
setting the hit parameter to logic high if the match address matches the at least one defect address, and setting the hit parameter to logic low if the match address does not match any of the at least one defect address.

14. The pre-match method of claim 11, wherein setting the Y-direction address comprises:
setting the Y-direction address as the redundancy address when the hit parameter is logic high, and setting the Y-direction address as the current address when the hit parameter is logic low.

15. The pre-match method of claim 11, further comprising:
checking a defect status in the memory array, so as to generate a mapping table which stores the at least one defect address.

16. The pre-match method of claim 11, wherein the memory array comprises a redundancy buffer and a redundancy cache, when the Y-direction address is set as the redundancy address, data corresponding to the Y-direction address is written into a redundancy buffer and outputted by a redundancy cache.

17. The pre-match method of claim 11, wherein the memory array comprises a page buffer and a normal cache, when the Y-direction address is set as the current address, data corresponding to the Y-direction address is written into the page buffer and outputted by the normal cache.

18. A pre-match method for a pre-match system comprising a memory array, the pre-match method comprising:
receiving an initial address;
gradually increasing a current address according to the initial address;
adding an offset value to the current address for generating a match address;
generating a hit parameter by comparing the match address with at least one defect address;
generating a redundancy address corresponding to the match address;
setting a Y-direction address as either the redundancy address or the current address according to the hit parameter, the Y-direction address being corresponding to accessing the memory array;

adding a next-stage offset value to the current address for generating a next-stage match address, wherein the next-stage offset value is different from the offset value;

generating a next-stage hit parameter by comparing the next-stage match address with at least one next-stage defect address stored in a next-stage mapping table;

generating a next-stage redundancy address corresponding to the next-stage match address;

overwriting the hit parameter by the next-stage hit parameter; and overwriting the redundancy address by the next-stage redundancy address.

\* \* \* \* \*